United States Patent
Su et al.

(10) Patent No.: US 9,742,505 B2
(45) Date of Patent: Aug. 22, 2017

(54) TESTING DEVICE AND TESTING METHOD THEREOF

(71) Applicant: ALIFECOM TECHNOLOGY CORP., Taipei (TW)

(72) Inventors: Meng-Kai Su, Taipei (TW); Yi-Chung Shen, Taipei (TW); Shih-Hsiang Hu, Taipei (TW); Heng-Iang Hsu, Taipei (TW); Shu-Hua Kao, Taipei (TW); Daching Chen, Taipei (TW)

(73) Assignee: ALIFECOM TECHNOLOGY CORP., Taipei (TW)

( * ) Notice: Subject to any disclaimer, the term of this patent is extended or adjusted under 35 U.S.C. 154(b) by 718 days.

(21) Appl. No.: 14/046,401

(22) Filed: Oct. 4, 2013

(65) Prior Publication Data
US 2015/0097570 A1    Apr. 9, 2015

(51) Int. Cl.
*H04B 17/00* (2015.01)
*G01R 31/28* (2006.01)

(52) U.S. Cl.
CPC ......... *H04B 17/00* (2013.01); *G01R 31/2834* (2013.01); *H04B 17/0085* (2013.01); *G01R 31/2822* (2013.01)

(58) Field of Classification Search
None
See application file for complete search history.

(56) References Cited

U.S. PATENT DOCUMENTS

| | | | | |
|---|---|---|---|---|
| 2002/0093358 A1* | 7/2002 | Kang | ................ | G01R 31/3193 324/756.02 |
| 2004/0161028 A1* | 8/2004 | Roberts | ................ | G01R 29/26 375/227 |
| 2008/0031180 A1* | 2/2008 | Hsieh | ................ | H04B 7/2606 370/315 |
| 2009/0219870 A1* | 9/2009 | Wengerter | ............ | H04L 1/1887 370/329 |
| 2010/0213950 A1* | 8/2010 | Liu | ................ | G01R 31/31907 324/537 |
| 2015/0025818 A1* | 1/2015 | Das | ........................ | H04W 24/10 702/58 |
| 2015/0063133 A1* | 3/2015 | Olgaard | ................ | H04W 24/08 370/252 |

FOREIGN PATENT DOCUMENTS

TW    201128388 A    8/2011
TW    M439178 U    10/2012

OTHER PUBLICATIONS

Taiwan Intellectual Property Office, Office Action, mailed Jun. 24, 2015 in Taiwan Application No. 103104044.

* cited by examiner

*Primary Examiner* — Melissa Koval
*Assistant Examiner* — Felicia Farrow
(74) *Attorney, Agent, or Firm* — Hauptman Ham, LLP

(57) ABSTRACT

A testing device includes a connecting module and a processor electrically connected to the connecting module. The connecting module is electrically coupled with a plurality of communication devices under tests (DUTs) synchronously. The processor determines a schedule for the communication DUTs and tests the communication DUTs according to the schedule. A testing method is applied to the testing device to implement the operations.

10 Claims, 8 Drawing Sheets

TESTING DEVICE AND TESTING METHOD THEREOF

CROSS-REFERENCES TO RELATED APPLICATIONS

Not applicable.

BACKGROUND OF THE INVENTION

Field of the Invention

The present invention relates to a testing device and a testing method thereof. More particularly, the present invention relates to a testing device for alternately testing a plurality of communication devices according to a schedule and a testing method thereof.

Descriptions of the Related Art

Communication devices (e.g., mobile phones, notebook computers, tablet computers, personal digital assistants (PDAs)) must be subjected to a number of quality assurance tests before shipment. Currently, testing devices for communication devices are generally classified into the non-signaling mode and the signaling mode. For testing devices of the non-signaling mode, it is unnecessary to perform a network attach procedure with a communication device under test (DUT) before the communication DUT is tested. The user has to control the testing device and the communication DUT simultaneously during the test. For testing devices of the signaling mode, a network attach procedure must be performed with the communication DUT before the communication DUT is tested. The user only needs to control the testing device during the test.

A conventional non-signaling or signaling testing device can only be electrically coupled with one communication device which is tested one at a time. If a plurality of communication devices is to be tested, the conventional testing device has to be electrically coupled with the communication devices individually and test the communication devices in sequence. In other words, it is not possible to couple the next communication device and test it until all testing items have been completed with the current communication device. Therefore, for the conventional testing device, the time spent in testing N communication devices is almost equal to N times of the time spent in testing a single communication device.

As the demand for communication devices has increased dramatically over recent years, the production of communication devices has also accelerated exponentially. Modern communication devices are required to deliver rich quality features and fast connection speed. Therefore, their embedded protocol software and transceiver hardware have evolved to become extremely complex, with intertwined impact on each other never seen before. This has driven modern communication devices to have many different operation modes, each optimized for a specific scenario, in order to utilize the limited spectrum resources more efficiently while maintaining the best quality of service. However, since conventional testing devices can only test a single communication device one at a time, the testing efficiency thereof is hardly able to meet the massive production and various verification needs of modern communication devices with different test characteristics and test items. In view of this, it is important to improve the testing efficiency of the conventional testing devices effectively.

SUMMARY OF THE INVENTION

The primary objective of the present invention is to improve the testing efficiency of conventional testing devices, and particularly to improve the testing efficiency of the conventional testing devices when testing a plurality of communication devices.

To achieve the aforesaid objective, the present invention provides a testing device. The testing device comprises a connecting module and a processor electrically connected with the connecting module. The connecting module is electrically coupled with a plurality of communication devices under test (DUTs) synchronously. The processor is configured to determine a schedule for the communication DUTs and alternately test the communication DUTs according to the schedule.

To achieve the aforesaid objective, the present invention further provides a testing method for use in a testing device. The testing device comprises a connecting module and a processor electrically connected with the connecting module. The testing method comprises the following steps:

(a) electrically coupling the connecting module with a plurality of communication DUTs synchronously; and (b) determining a schedule for the communication DUTs and alternately testing the communication DUTs according to the schedule by the processor.

Specifically, the present invention provides a testing device and a testing method thereof. With the aforesaid arrangement of the connecting module, the testing device can be electrically coupled with a plurality of communication DUTs synchronously to save the time that would have otherwise been consumed in electrically coupling the testing device repeatedly each time a communication device is tested. With the aforesaid arrangement of the processor, the testing device determines a schedule for all testing items of the communication DUTs and alternately tests the communication DUTs according to the schedule so that the total time necessary for testing the communication DUTs is shortened. The testing method is applied to the testing device to implement the aforesaid operations. Thereby, the present invention can improve the testing efficiency of the conventional testing devices effectively.

The detailed technology and preferred embodiments implemented for the subject invention are described in the following paragraphs accompanying the appended drawings for persons skilled in this field to well appreciate the features of the claimed invention.

DESCRIPTION OF THE PREFERRED EMBODIMENT

In the following description, the present invention will be explained with reference to embodiments thereof. However, these embodiments are not intended to limit the present invention to any specific environment, applications or particular implementations described in these embodiments. Therefore, the description of these embodiments is only for the purpose of illustration rather than limitation. In the following embodiments and attached drawings, elements unrelated to the present invention are omitted from the depictions; and dimensional relationships among individual elements in the attached drawings are illustrated only for ease of understanding but not to limit the actual scales.

Figure 1:
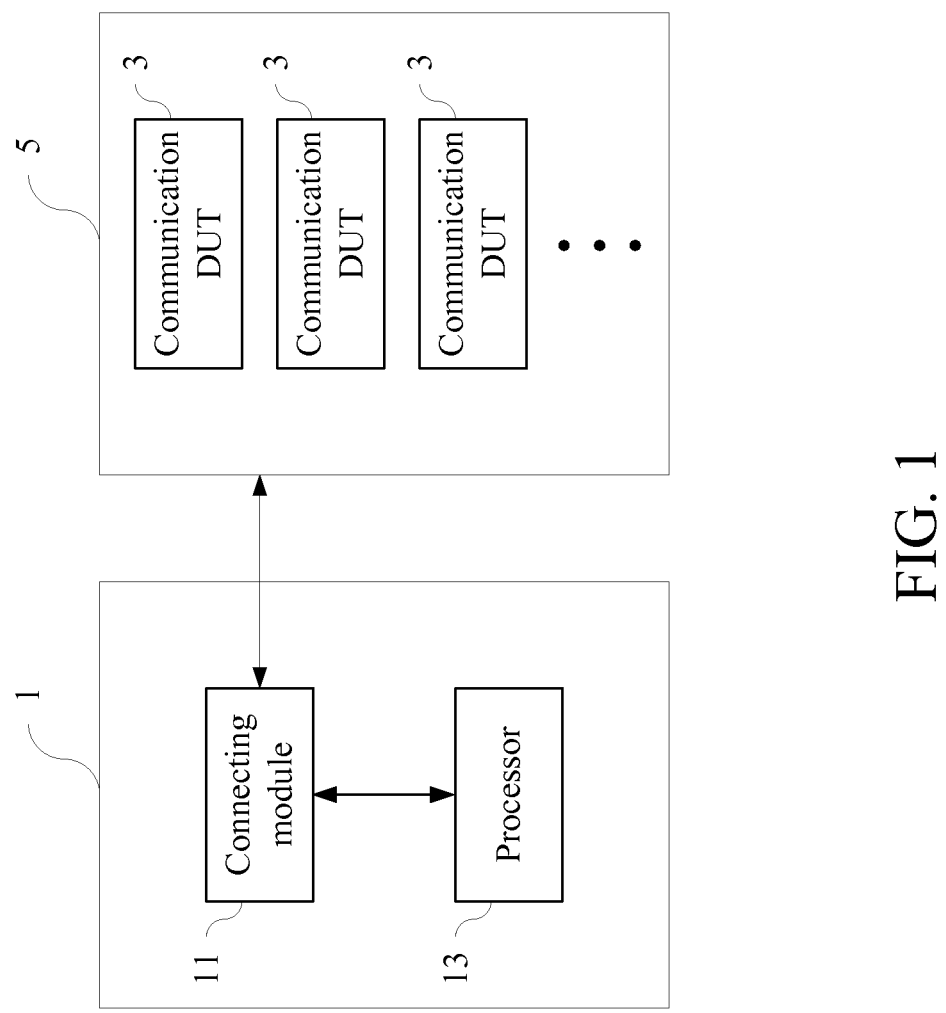
FIG. 1 is a structural schematic view of a testing device 1 according to a first embodiment of the present invention.

A first embodiment of the present invention is a testing device. A schematic structural view of the testing device is shown in FIG. 1. As shown in FIG. 1, the testing device 1 comprises a connecting module 11 and a processor 13 electrically connected to the connecting module 11. Unlike the conventional testing device that must be electrically coupled with each of a plurality of communication DUTs 3 in sequence, the connecting module 11 may comprise a one-to-multiple synchronous connecting element, a multiple-to-multiple synchronous connecting element or the like to be electrically coupled with the communication DUTs 3 synchronously.

In practice, the connecting module 11 may optionally be electrically coupled with the communication DUTs 3 via a shielding box 5. Through the shielding effect of the shielding box 5, the communication DUTs 3 disposed in the shielding box 5 can be free from interferences incurred by various external signals and noises. In this way, the electrically coupling between the connecting module 11 and the communication DUTs 3 becomes more stable, so the quality of testing the communication DUTs 3 can be improved. The communication DUTs 3 may be disposed in the same space in the shielding box 5 or in spaces independent from each other in the shielding box 5. In another embodiment, the connecting module 11 may also be electrically coupled with the communication DUTs 3 via a splitter.

The testing device 1 is not limited to any specific communication transmission specification. For example, if the communication DUTs 3 conform to the Long Term Evolution (LTE) specification, then the testing device 1 can test the communication DUTs 3 according to the LTE specification. Alternatively, if the communication DUTs 3 conform to the Worldwide Interoperability for Microwave Access (WiMAX) specification, then the testing device 1 can test the communication DUTs 3 according to the WiMAX specification. In other words, the testing device 1 is applicable to various different communication transmission specifications for various tests.

Unlike the conventional testing device that must test each of the communication DUTs in sequence, the processor 13 determines a schedule for the communication DUTs 3 after the connecting module 11 is electrically coupled with the communication DUTs 3 synchronously and tests the communication DUTs 3 according to the schedule. In other embodiments, the testing device 1 further comprises a display (not shown) that displays a testing result of the communication DUTs 3 after the processor 13 has performed the test according to the schedule and made statistics of the communication DUTs 3. Through the adaptive schedule mechanism, a plurality of testing items necessary for the communication DUTs 3 can be alternately tested by the testing device 1. Thus, the tests of the next communication DUT 3 is unnecessary to wait for the completion of all necessary testing items on the current communication DUT 3.

Furthermore, the processor 13 can determine a time domain schedule, a frequency domain schedule or a time-frequency domain schedule as the schedule for the communication DUTs 3 depending on different conditions. In other embodiments, the processor 13 may also determine other schedules with different types for the communication DUTs 3. Hereinafter, the method in which the processor 13 determines each of the aforesaid three schedules for the communication DUTs 3 and tests the communication DUTs 3 according to the schedules will be described respectively.

First, the application of the time domain schedule will be described. The time domain schedule means that the processor 13 schedules testing of the communication DUTs 3 in the time domain. Specifically, the processor 13 assigns at least one sub-frame to each of the communication DUTs 3 in a time interval according to the time domain schedule, and tests the corresponding communication DUT 3 in each of the sub-frames. The at least one sub-frame may be viewed as one or more sub-frames.

The processor 13 tests each of the communication DUTs in the time interval according to testing conditions, testing items or the combination thereof. The testing conditions may include various testing conditions, such as modulation and coding scheme (MCS), bandwidth, etc. The testing items may include various testing items, such as throughput, Quality of Service (QoS), transmitting power, testing time, etc.

Specifically, the processor 13 can test different communication DUTs 3 with an identical testing item or with different testing items in the sub-frames of the time interval. The processor 13 can test different communication DUTs 3 with an identical testing condition or with different testing conditions in the sub-frames of the time interval.

Moreover, if the processor 13 assigns a plurality of sub-frames to a communication DUT 3 in the time interval, then the processor 13 can test the communication DUT 3 with an identical testing item or with different testing items in the sub-frames of the time interval. Additionally, the processor 13 can test the communication DUT 3 with an identical testing condition or according to different testing conditions.

Hereinafter, the time domain schedule will be further described with reference to Table 1 and FIG. 2 as an example. As shown in Table 1 and FIG. 2, there are four communication DUTs (i.e., DUT1, DUT2, DUT3, DUT4) to be tested in total. In a time interval D1, the processor 13 assigns a same resource block to the communication DUTs DUT1, DUT2, DUT3, DUT4. The processor 13 assigns three sub-frames (i.e., SF1, SF8 and SF9) to DUT1, two sub-frames (i.e., SF2 and SF7) to DUT2, two sub-frames (i.e., SF3 and SF6) to DUT3, and two sub-frames (i.e., SF4 and SF5) to DUT 4.

For DUT1, the processor 13 tests different testing items T11, T12 and T13 with different testing conditions C11, C12 and C13 in the sub-frames SF1, SF8 and SF9 respectively. For DUT2, the processor 13 tests the same testing item T21 with different testing conditions C21 and C22 in the sub-frames SF2 and SF7 respectively. For DUT3, the processor 13 tests a testing item T31 with a testing condition C31 in each of the sub-frames SF3 and SF6. For DUT4, the processor 13 tests different testing items T41 and T42 with a testing condition C41 in the sub-frames SF4 and SF5 respectively.

Figure 2:
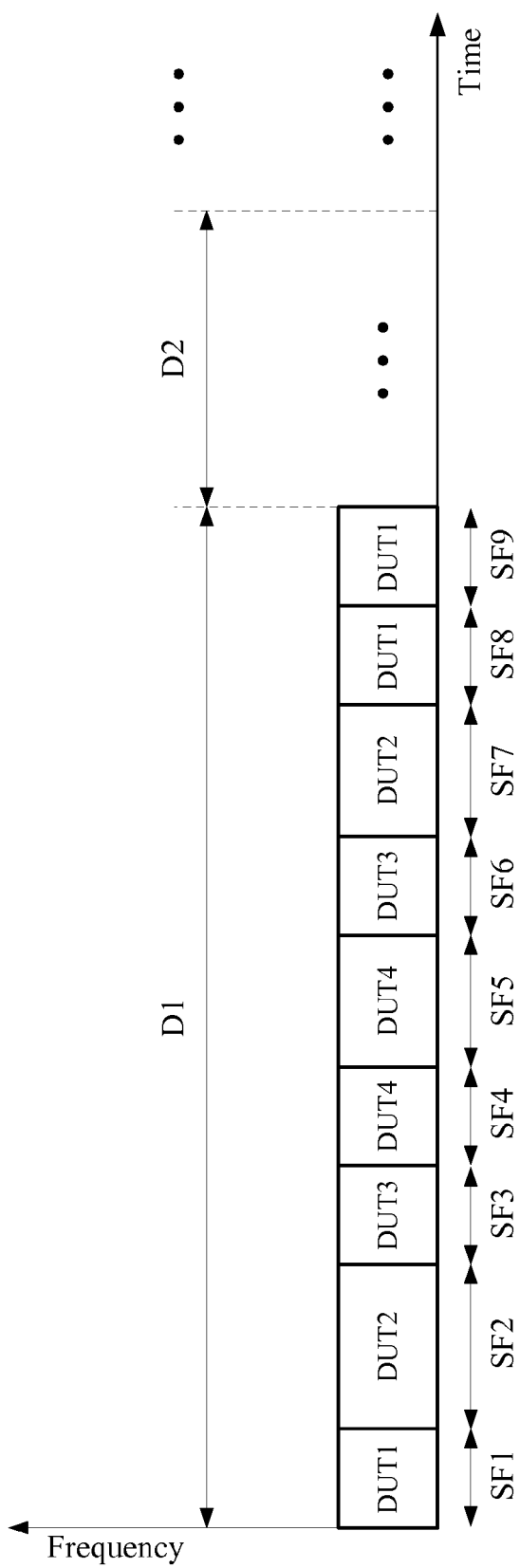
FIG. 2 is a schematic view illustrating a time domain schedule according to the first embodiment of the present invention.

In other time intervals, such as the time interval D2 shown in FIG. 2, the processor 13 can test the communication DUTs DUT1, DUT2, DUT3, DUT4 repeatedly according to the same time domain schedule as applied in the time interval D1, or re-arranges the testing orders of the communication DUTs DUT1, DUT2, DUT3 and DUT4 according to a new time domain schedule.

Therefore, the processor 13 may assign different numbers of sub-frames to each of the communication DUTs 3 and determine the length of each of the sub-frames depending on different testing requirements. The processor 13 may also determine a total number of time domain intervals depending on different testing requirements; and in each of the time intervals, the processor 13 can perform an identical testing item or different testing items on each of the communication DUTs 3 with an identical testing condition or with different testing conditions in the corresponding sub-frames. Additionally, the processor 13 can assign the sub-frames to the communication DUTs 3 in different alternating manners depending on different testing requirements.

TABLE 1

| Communication DUTs | Sub-frames | Testing conditions | Testing items |
|---|---|---|---|
| DUT1 | SF1 | C11 | T11 |
|  | SF8 | C12 | T12 |
|  | SF9 | C13 | T13 |
| DUT2 | SF2 | C21 | T21 |
|  | SF7 | C22 | T21 |
| DUT3 | SF3 | C31 | T31 |
|  | SF6 | C31 | T31 |
| DUT4 | SF4 | C41 | T41 |
|  | SF5 | C41 | T42 |

The conventional testing device can only test a plurality of communication devices in sequence, i.e., can only test one communication DUT in each time interval. Consequently, if the time needed by the testing of the communication DUT is shorter than the time interval, the testing device will enter into an idle status in a certain period of time within the time interval, thus causing degradation of the testing efficiency. However, through the aforesaid time domain scheduling, the time intervals can be efficiently used for testing, so the time duration in which the testing device remains idle can be effectively shortened. Furthermore, because a plurality of testing items necessary for a plurality of communication DUTs can be tested alternately in the time domain, flexibility and adaptability of the testing can also be improved. In other words, through the aforesaid time domain scheduling, the testing efficiency of the conventional testing device can be effectively improved.

Next, the application of the frequency domain schedule will be described. The frequency domain schedule means that the processor 13 schedules testing of the communication DUTs 3 in the frequency domain. Specifically, the processor 13 assigns at least one resource block to each of the communication DUTs 3 in a frequency interval according to the frequency domain schedule, and tests the corresponding communication DUTs 3 in each of the resource blocks. The at least one resource block may be one or more resource blocks.

The processor 13 tests each of the communication DUTs in the frequency interval according to testing conditions, testing items or the combination thereof. The testing conditions may include various testing conditions, such as MCS, bandwidth, etc. The testing items may include various testing items, such as throughput, QoS, transmitting power, testing time, etc.

Specifically, the processor 13 can test different communication DUTs 3 with an identical testing item or with different testing items in the resource blocks of the frequency interval. The processor 13 can test different communication DUTs 3 with an identical testing condition or with different testing conditions in the resource blocks of the frequency interval.

Moreover, if the processor 13 assigns a plurality of resource blocks to a communication DUT 3 in the frequency interval, then the processor 13 can test the communication DUT 3 with an identical testing item or with different testing items in the resource blocks of the frequency interval. Additionally, the processor 13 can test the communication DUT 3 with an identical characteristic or with different characteristics.

Hereinafter, the frequency domain schedule will be further described with reference to Table 2 and FIG. 3 as an example. As shown in Table 2 and FIG. 3, there are four communication DUTs (i.e., DUT1, DUT2, DUT3, DUT4) to be tested in total. In a frequency interval F1, the processor 13 assigns a sub-frame to the communication DUTs DUT1, DUT2, DUT3, DUT4; and the processor 13 assigns one resource block (i.e., RB3) to DUT1, three resource blocks (i.e., RB1, RB2 and RB5) to DUT2, one resource block (i.e., RB6) to DUT3, and two resource blocks (i.e., RB4 and RB7) to DUT4.

For DUT1, the processor 13 tests a testing item T11 with a testing condition C11 in the resource block RB3. For DUT2, the processor 13 tests different testing items T21, T22 and T23 with different testing conditions C21, C22 and C23 in the resource blocks RB1, RB2 and RB5 respectively. For DUT3, the processor 13 tests a testing item T31 with a testing condition C31 in the resource block RB6. For DUT4, the processor 13 tests different testing items T41 and T42 with a testing condition C41 in the resource blocks RB4 and RB7 respectively.

Figure 3:
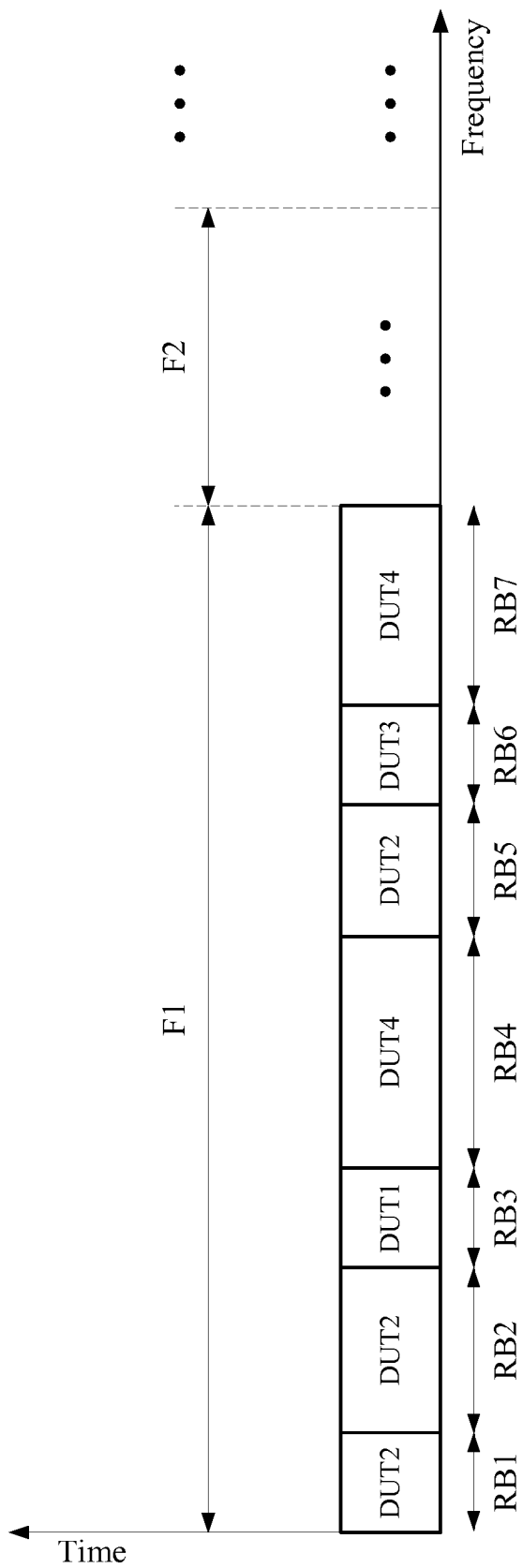
FIG. 3 is a schematic view illustrating a frequency domain schedule according to the first embodiment of the present invention.

In other frequency intervals, such as the frequency interval F2 shown in FIG. 3, the processor 13 can test the communication DUTs DUT1, DUT2, DUT3, DUT4 repeatedly according to the same frequency domain schedule as applied in the frequency interval F1, or re-arranges the testing orders of the communication DUTs DUT1, DUT2, DUT3 and DUT4 according to a new frequency domain schedule.

Therefore, the processor 13 may assign different numbers of resource blocks to each of the communication DUTs 3 and determine the length of each of the resource blocks depending on different testing requirements. The processor 13 may also determine a total number of frequency intervals depending on different testing requirements. In each of the frequency intervals, the processor 13 can perform an identical testing item or different testing items on each of the communication DUTs 3 with an identical testing condition or with different testing conditions in the corresponding resource blocks. Additionally, the processor 13 can assign the resource blocks to the communication DUTs 3 in different alternating manners depending on different testing requirements.

TABLE 2

| Communication DUTs | Resource Blocks | Testing conditions | Testing items |
|---|---|---|---|
| DUT1 | RB3 | C11 | T11 |
| DUT2 | RB1 | C21 | T21 |
|  | RB2 | C22 | T22 |
|  | RB5 | C23 | T23 |
| DUT3 | RB6 | C31 | T31 |
|  | RB4 | C41 | T41 |
| DUT4 | RB7 | C41 | T42 |

A conventional testing device can only test a plurality of communication devices in sequence (i.e., in a serial manner), so the time needed to test the communication devices is directly proportional to the number of the communication devices. Through the aforesaid frequency domain schedule, the testing items of the communication DUTs 3 can be tested synchronously in one sub-frame (i.e., within a unit time), so that testing in a parallel manner can be achieved to remarkably reduce the time needed to test the communication DUTs 3. Furthermore, because the plurality of testing items needed by the communication DUTs 3 can be alternately tested in the frequency domain, the flexibility and adaptability of testing can also be improved. In other words, the aforesaid frequency domain scheduling will effectively improve the testing efficiency of the conventional testing device.

The application of time-frequency domain schedule will be described. The time-frequency domain schedule means that the processor 13 schedules testing of the communication DUTs 3 in the time-frequency domain. Specifically, the processor 13 assigns at least one sub-frame and at least one resource block to each of the communication DUTs 3 in a time-frequency two-dimensional interval according to the time-frequency domain schedule. The corresponding communication DUT 3 is tested in each of the sub-frames and each of the resource blocks. The at least one sub-frame may be one or more sub-frames, and the at least one resource block may be one or more resource blocks.

The processor 13 tests each of the communication DUTs in the time-frequency two-dimensional interval according to testing conditions, testing items or the combination thereof. The testing conditions may include various testing conditions, such as MCS, bandwidth, etc. The testing items may include various testing items, such as throughput, QoS, transmitting power, testing time, etc.

Specifically, the processor 13 can test different communication DUTs 3 with an identical testing item or with different testing items in the sub-frames and/or the resource blocks of the time-frequency two-dimensional interval. The processor 13 can test different communication DUTs 3 with an identical testing condition or with different testing conditions in the sub-frames and/or the resource blocks of the time-frequency two-dimensional interval.

If the processor 13 assigns a plurality of sub-frames and/or a plurality of resource blocks to a communication DUT 3 in the time-frequency two-dimensional interval, then the processor 13 can test the communication DUT 3 with an identical testing item or with different testing items in the sub-frames and/or the resource blocks. Additionally, the processor 13 can test the communication DUT 3 with an identical characteristic or with different characteristics.

Figure 4:
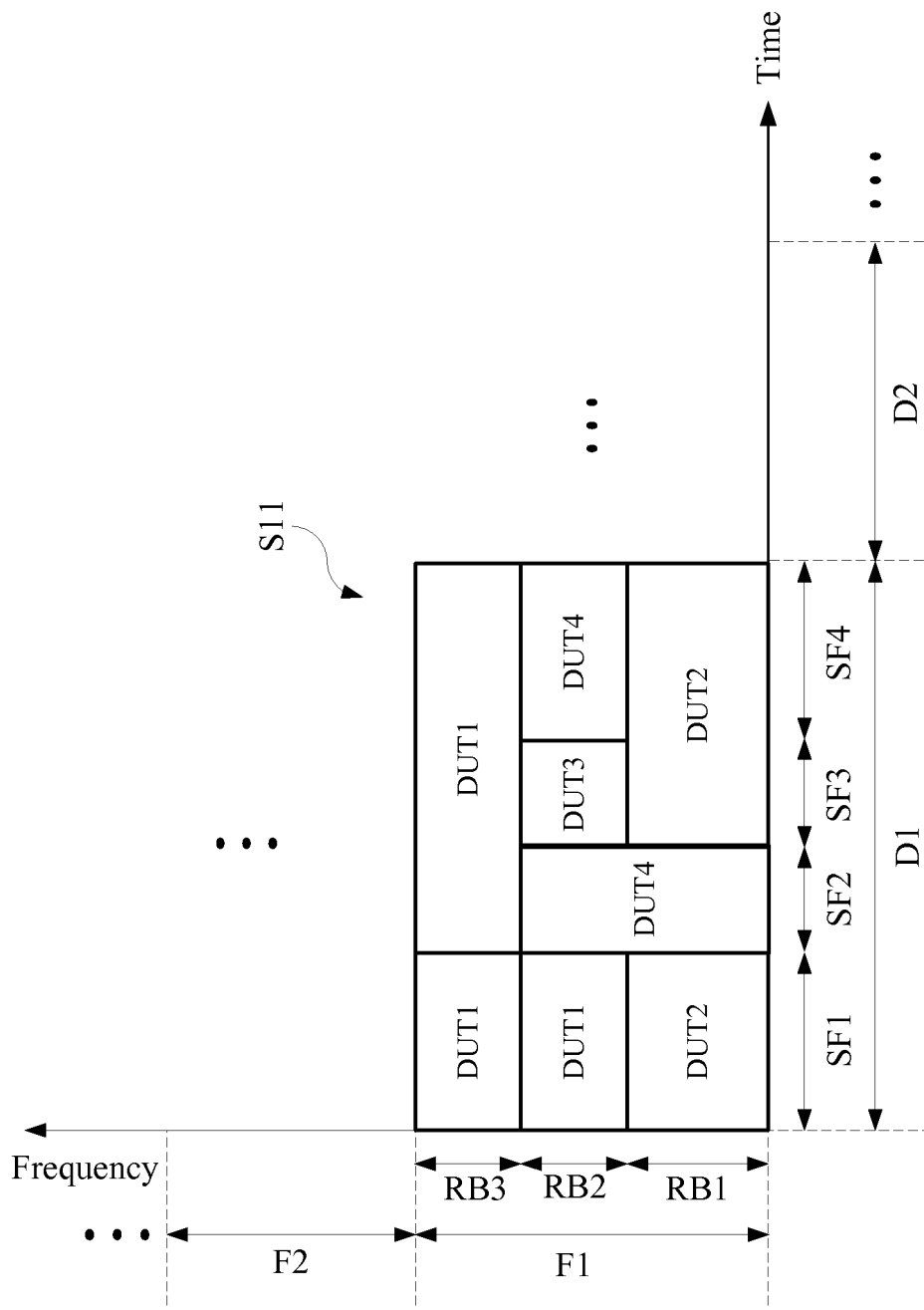
FIG. 4 is a schematic view illustrating a time-frequency domain schedule according to the first embodiment of the present invention.

Hereinafter, the time-frequency domain schedule will be further described with reference to Table 3 and FIG. 4. As shown in Table 3 and FIG. 4, there are four communication DUTs (i.e., DUT1, DUT2, DUT3, DUT4) to be tested in total. A time interval D1 and a frequency interval F1 form a time-frequency two-dimensional interval S11. In the time-frequency two-dimensional interval S11, the processor 13 assigns two resource blocks (i.e., RB2 and RB3) in the sub-frame SF1 and one resource block (i.e., RB3) in the sub-frames SF2, SF3 and SF4 to DUT1; assigns one resource block (i.e., RB1) in the sub-frames SF1, SF3 and SF4 to DUT2; assigns one resource block (i.e., RB2) in the sub-frame SF3 to DUT3; and assigns two resource blocks (i.e., RB1 and RB2) in the sub-frame SF2 and one resource block (i.e., RB2) in the sub-frame SF4 to DUT4.

For DUT1, the processor 13 tests different testing items T11 and T12 with different testing conditions C11 and C12 in the resource blocks RB2 and RB3 of the sub-frame SF1 respectively. A testing item T13 is tested with a testing condition C13 in the resource block RB3 of the sub-frames SF1, SF2 and SF3. For DUT2, the processor 13 tests a testing item T21 with a testing condition C21 in the resource block RB1 of the sub-frame SF1; and tests a testing item T22 with a testing condition C22 in the resource block RB1 of the sub-frames SF3 and SF4.

For DUT3, the processor 13 tests a testing item T31 with a testing condition C31 in the resource block RB2 of the sub-frame SF3. For DUT4, the processor 13 tests a testing item T41 with a testing condition C41 in the resource blocks RB1 and RB2 of the sub-frame SF2; and tests a testing item T42 with a testing condition C42 in the resource block RB2 of the sub-frame SF4.

In other time-frequency two-dimensional intervals, the processor 13 can test the communication DUTs DUT1, DUT2, DUT3, DUT4 repeatedly according to the same time-frequency domain schedule as applied in the time-frequency two-dimensional interval S11, or re-arranges the testing orders of the communication DUTs DUT1, DUT2, DUT3 and DUT4 according to a new time-frequency domain schedule.

Therefore, the processor 13 may assign different numbers of sub-frames and different numbers of resource blocks to each of the communication DUTs 3 and determine the length of each of the sub-frames and each of the resource blocks depending on different testing requirements. The processor 13 may also determine a total number of time-frequency two-dimensional intervals depending on different testing requirements. In each of the time-frequency two-dimensional intervals, the processor 13 can perform an identical testing item or different testing items on each of the communication DUTs 3 with an identical testing condition or with different testing conditions in the corresponding sub-frames and resource blocks. Additionally, the processor 13 can assign the sub-frames or resource blocks to the communication DUTs 3 in different alternating manners depending on different testing requirements.

TABLE 3

| Communication DUTs | Sub-frames | Resource Blocks | Testing conditions | Testing items |
|---|---|---|---|---|
| DUT1 | SF1 | RB2 | C11 | T11 |
| | SF1 | RB3 | C12 | T12 |
| | SF2 + SF3 + SF4 | RB3 | C13 | T13 |
| DUT2 | SF1 | RB1 | C21 | T21 |
| | SF3 + SF4 | RB1 | C22 | T22 |
| DUT3 | SF3 | RB2 | C31 | T31 |
| DUT4 | SF2 | RB1 + RB2 | C41 | T41 |
| | SF4 | RB2 | C42 | T42 |

The time-frequency scheduling has all the effects and advantages of both the time domain schedule and the frequency domain schedule described above. Therefore, the time-frequency domain schedule can remarkably reduce the time needed to test a plurality of communication DUTs 3 and improve the testing with better flexibility and adaptability. In other words, the aforesaid time-frequency domain scheduling will effectively improve the testing efficiency of the conventional testing device.

Figure 5:
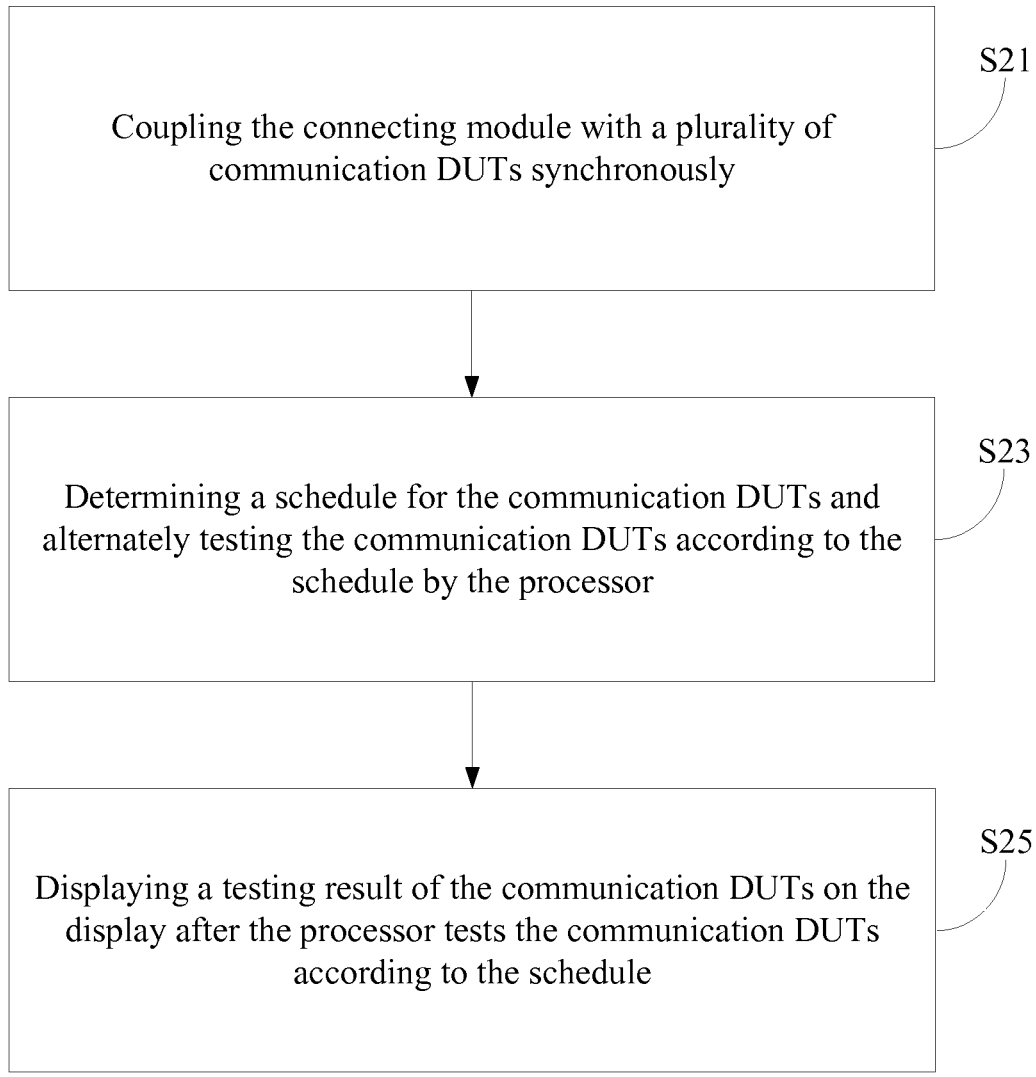
FIG. 5 is a flowchart diagram of a testing method according to a second embodiment of the present invention.

A second embodiment of the present invention is a testing method for use in a testing device; a flowchart diagram of which is shown in FIG. 5. The testing method of this embodiment may be used in the testing device 1 described in the first embodiment. Therefore, the testing device and the communication DUTs described in this embodiment may be considered as the testing device 1 and the communication DUTs 3 as described in the first embodiment. The testing device described in this embodiment may comprise a connecting module and a processor electrically connected with the connecting module.

As shown in FIG. 5, step S21 is executed to couple the connecting module with a plurality of communication DUTs synchronously. Optionally, the connecting module is electrically coupled with the communication DUTs synchronously via a shielding box. In another embodiment, the connecting module may also be electrically coupled with the communication DUTs via a splitter or in the air. Step S23 is executed to determine a schedule for the communication DUTs and tests the communication DUTs according to the schedule by the processor.

If the testing device further comprises a display electrically connected with the processor, step S25 may be optionally executed after the step S23 to display a testing result of the communication DUTs on the display after the processor tests the communication DUTs according to the schedule. Step S25 is not essential to the testing method described in this embodiment, and is not intended to limit the present invention.

Figure 6A:
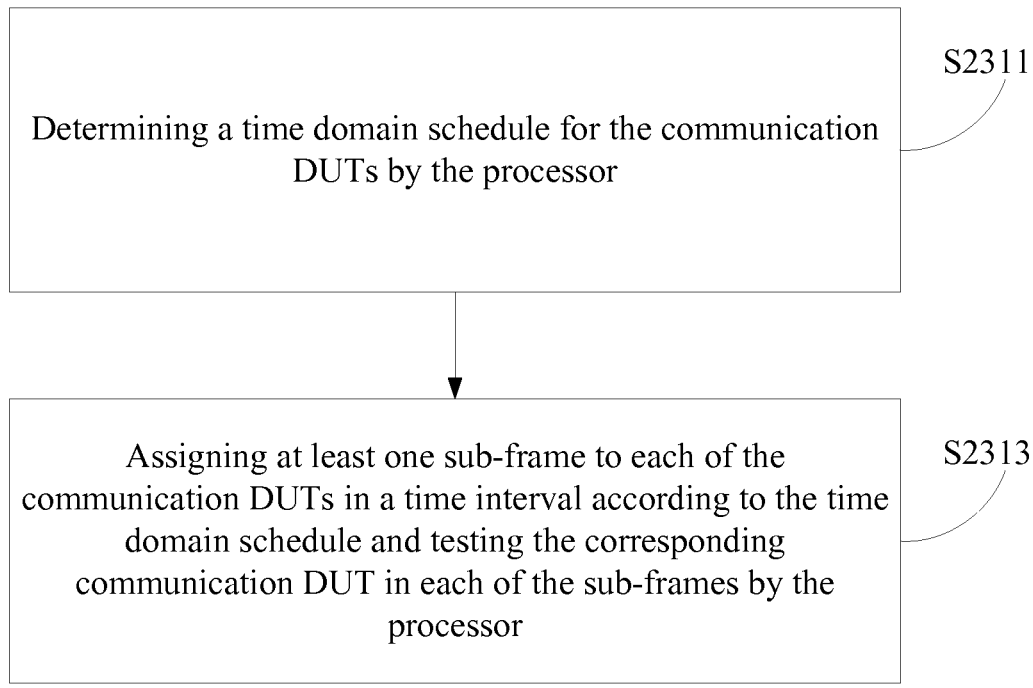
FIGS. 6A, 6B and 6C illustrate different sub-steps of the step S23 shown in the second embodiment of the present invention.
Figure 6B:
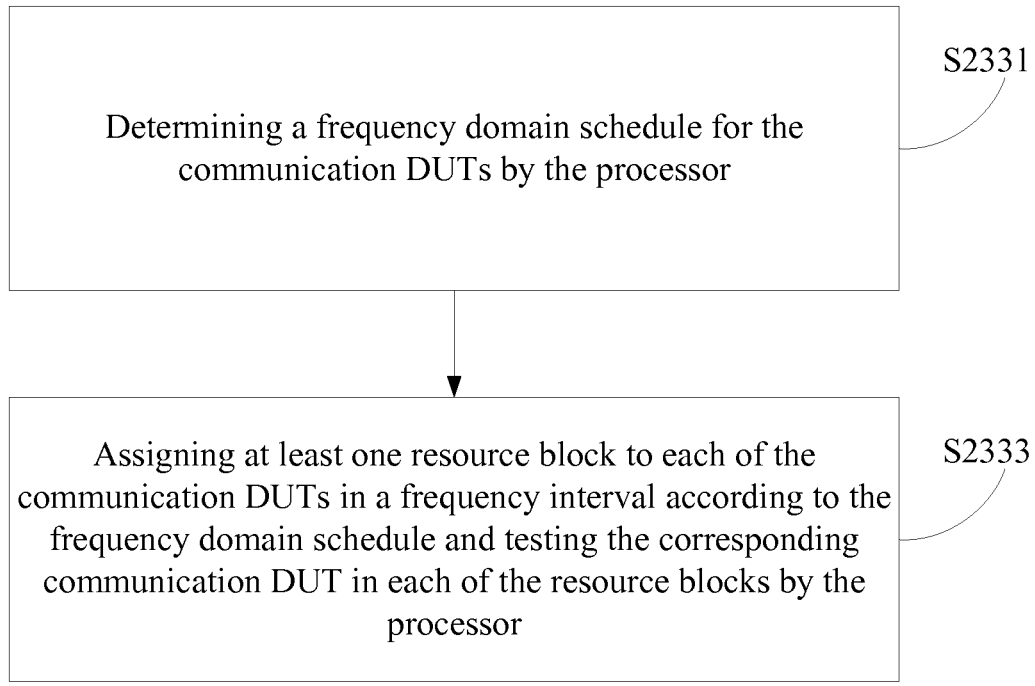
Figure 6C:
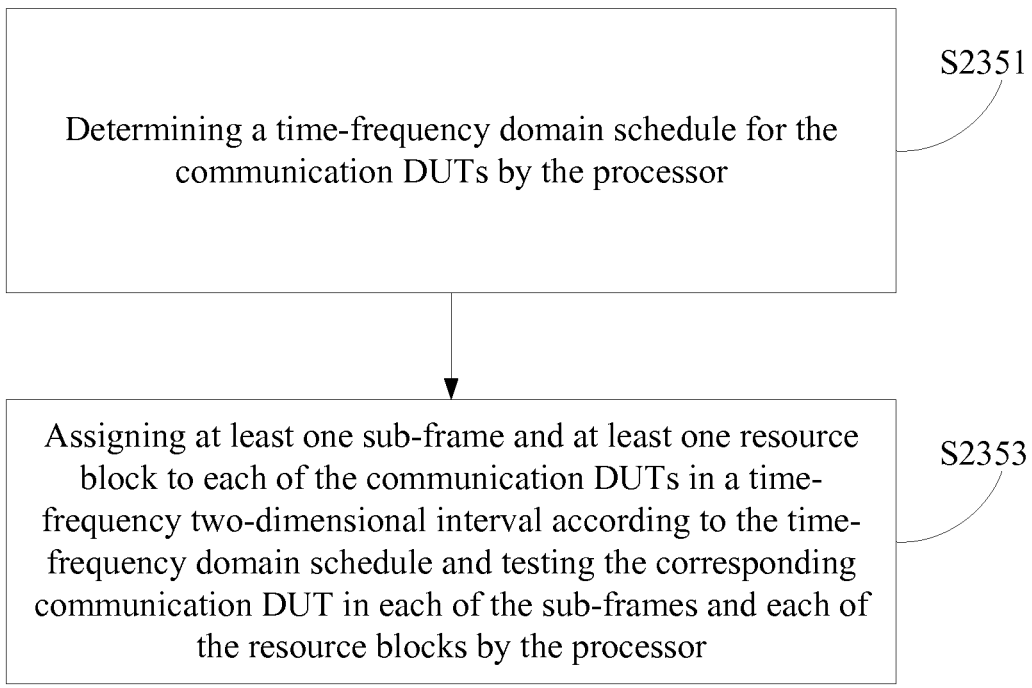

Step S23 may comprise different sub-steps as shown in FIG. 6A, FIG. 6B and FIG. 6C depending on different testing requirements. As shown in FIG. 6A, step S23 further comprises sub-steps S2311 and S2313. Sub-step S2311 is executed to determine a time domain schedule for the communication DUTs by the processor. Sub-step S2313 is executed to assign at least one sub-frame to each of the communication DUTs according to the time domain schedule and test the corresponding communication DUT in each of the sub-frames by the processor. Optionally, the processor may test each of the communication DUTs in the time domain interval according to testing conditions, testing items, or the combination thereof.

As shown in FIG. 6B, step S23 further comprises sub-steps S2331 and S2333. Sub-step S2331 is executed to determine a frequency domain schedule for the communication DUTs by the processor. Sub-step S2333 is executed to assign at least one resource block to each of the communication DUTs according to the frequency domain schedule and test the corresponding communication DUT in each of the resource blocks by the processor. Optionally, the processor may also test each of the communication DUTs in the frequency domain interval according to the testing conditions, testing items, or combination thereof.

As shown in FIG. 6C, step S23 further comprises sub-steps S2351 and S2353. Sub-step S2351 is executed to determine a time-frequency domain schedule for the communication DUTs by the processor. Sub-step S2353 is executed to assign at least one sub-frame and at least one resource block to each of the communication DUTs in a time-frequency two-dimensional interval according to the time-frequency domain schedule and test the corresponding communication DUT in each of the sub-frames and each of the resource blocks by the processor. Optionally, the processor may test each of the communication DUTs in the time-frequency two-dimensional interval according to the testing conditions, testing items, or combination thereof.

In addition to the aforesaid steps, the testing method of this embodiment further comprises other steps corresponding to all the operations of the testing device 1 set forth in the first embodiment and accomplishes all the corresponding functions. Since the steps which are not described in this embodiment can be readily appreciated by persons of ordinary skill in the art based on the explanations of the first embodiment, they will not be further described herein.

According to the above descriptions, the present invention provides a testing device and a testing method thereof. With the aforesaid arrangement of the connecting module, the testing device can be electrically coupled with a plurality of communication DUTs synchronously to save the time that would otherwise be consumed in electrically coupling the testing device repeatedly each time a communication device is tested. With the aforesaid arrangement of the processor, the testing device determines a schedule for all testing items of the communication DUTs and alternately tests the communication DUTs according to the schedule, so the total time necessary for testing the communication DUTs is shortened. The testing method is applied to the testing device to implement the aforesaid operations. Thereby, the present invention can improve the testing efficiency of the conventional testing devices effectively.

The above disclosure is related to the detailed technical contents and inventive features thereof. Persons skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A testing device, comprising:
   a connecting module, electrically coupled with a plurality of communication DUTs synchronously; and
   a processor, electrically connected with the connecting module and configured to determine a schedule for testing the communication DUTs;
   wherein the schedule is a time-frequency domain schedule where the communication DUTs are tested in an interlaced way in a time-frequency two-dimensional domain, and the processor is further configured to:
   assign at least one sub-frame and at least one resource block to each of the communication DUTs in the interlaced way in the time-frequency two-dimensional domain; and
   test each of the communication DUTs according to the assigned at least one sub-frame and the assigned at least one resource block.

2. The testing device as claimed in claim 1, wherein the processor tests each of the communication DUTs in the time-frequency two-dimensional interval according to various testing conditions associated with a specification of a wireless communication system.

3. The testing device as claimed in claim 1, wherein the processor tests each of the communication DUTs in the time-frequency two-dimensional interval according to various testing items associated with performance of a wireless communication system.

4. The testing device as claimed in claim 1, wherein the processor tests each of the communication DUTs in the time-frequency two-dimensional interval according to various testing conditions associated with a specification of a wireless communication system and various testing items associated with performance of the wireless communication system.

5. The testing device as claimed in claim 1, further comprising a display, which is configured to display a testing result of the communication DUTs after the processor tests the communication DUTs according to the schedule.

6. A testing method for use in a testing device, the testing device comprising a connecting module and a processor electrically connected with the connecting module, the testing method comprising the steps of:
- (a) electrically coupling the connecting module with a plurality of communication DUTs synchronously; and
- (b) determining a schedule for testing the communication DUTs by the processor;

wherein the step (b) further comprises the steps of:
- (b1) determining a time-frequency domain schedule where the communication DUTs are tested in an interlaced way in a time-frequency two-dimensional domain by the processor; and
- (b2) assigning at least one sub-frame and at least one resource block to each of the communication DUTs in the interlaced way in the time-frequency two-dimensional domain and testing each of the communication DUTs according to the assigned at least one sub-frame and the assigned at least one resource block by the processor.

7. The testing method as claimed in claim 6, wherein the processor tests each of the communication DUTs in the time-frequency two-dimensional interval according to various testing conditions associated with a specification of a wireless communication system.

8. The testing method as claimed in claim 6, wherein the processor tests each of the communication DUTs in the time-frequency two-dimensional interval according to various testing items associated with performance of a wireless communication system.

9. The testing method as claimed in claim 6, wherein the processor tests each of the communication DUTs in the time-frequency two-dimensional interval according to various testing conditions associated with a specification of a wireless communication system and various testing items associated with performance of the wireless communication system.

10. The testing method as claimed in claim 6, wherein the testing device further comprises a display and the testing method further comprises the step of:
- (c) displaying a testing result of the communication DUTs on the display after the processor tests the communication DUTs according to the schedule.

* * * * *